US008441847B2

(12) United States Patent
Eleftheriou et al.

(10) Patent No.: US 8,441,847 B2
(45) Date of Patent: May 14, 2013

(54) PROGRAMMING MULTI-LEVEL PHASE CHANGE MEMORY CELLS

(75) Inventors: Evangelos S Eleftheriou, Zurich (CH); Angeliki Pantazi, Zurich (CH); Nikolaos Papandreou, Zurich (CH); Charalampos Pozidis, Zurich (CH); Abu Sabastian, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 12/887,850

(22) Filed: Sep. 22, 2010

(65) Prior Publication Data

US 2011/0069539 A1    Mar. 24, 2011

(30) Foreign Application Priority Data

Sep. 23, 2009   (EP) ..................................... 09171127

(51) Int. Cl.
*G11C 11/00*         (2006.01)
(52) U.S. Cl.
USPC ......................................... 365/163; 365/148

(58) Field of Classification Search .................. None
See application file for complete search history.

(56) References Cited

U.S. PATENT DOCUMENTS

| 7,372,725 | B2 | 5/2008 | Philipp et al. | |
| 7,564,710 | B2 | 7/2009 | Happ et al. | |
| 2007/0297221 | A1 | 12/2007 | Philipp et al. | |
| 2008/0123389 | A1* | 5/2008 | Cho et al. ..................... | 365/148 |

* cited by examiner

*Primary Examiner* — Hoai V Ho
*Assistant Examiner* — James G Norman
(74) *Attorney, Agent, or Firm* — Eustus Nelson; Michael J. Chang, LLC

(57) ABSTRACT

A method and a feedback controller for programming at least one multi-level phase-change memory cell with a programming signal. The method and feedback controller include a sequence of write pulses applied to the multi-level phase change memory cell, wherein the feedback controller adjusts in real time at least one parameter of each write pulse as a function of a determined resistance error of the phase-change memory cell with respect to a desired reference resistance level.

12 Claims, 5 Drawing Sheets

PROGRAMMING MULTI-LEVEL PHASE CHANGE MEMORY CELLS

CROSS REFERENCE TO RELATED APPLICATION

This application claims priority under 35 U.S.C. 119 from European Application 09171127.5 filed Sep. 23, 2009, the entire contents of which are incorporated herein by reference.

BACKGROUND OF THE INVENTION

1. Field of the Invention

The present invention relates to programming of a multi-level phase change memory cell and in particular to a programming scheme for fast multi-level recording.

2. Description of Related Art

Phase change memories, which are also known as PCM, PRAM, PCRAM, Chalgogenide RAM and C-RAM, are non-volatile solid state memories which can satisfy the needs for a random access memory as well as mass data storage. These phase change memories use the unique behavior of a phase change material such as chalgogenide glass which can be switched between two states, i.e. a crystalline state and an amorphous state. In the amorphous state the phase change material includes a high resistance whereas in the crystalline state the phase change material has a low resistance. Since, in the crystalline and amorphous state the phase change material has different electrical resistivity, this physical property can be used to store data. The amorphous state, which has a high resistance, can be used to represent a logical zero, whereas the crystalline, low resistance state can be used to represent a logical one. A phase change memory cell can be programmed to include more than two different resistance levels. A memory cell can, for example, be programmed to have four different levels of resistance spanning the range, for example, from 10 kΩ to 10 MΩ. The low resistance level of 10 kΩ could correspond to two logical bits 00, the next resistance level of 100 kΩ could represent two logical bits 01, the next higher resistance level of, for example, 1 MΩ could represent a logical bit combination of 10, and the highest resistance level of 10 MΩ could represent logical bits 11. Accordingly, a phase change memory cell can form a multi-level phase change memory cell having multiple resistance levels to store more than one bit in a single memory cell. The capability of multi-level phase change memory cells for storing multiple bits in one cell increases the effective storage density of a phase change memory. Each of the resistance levels or states can have different physical properties that can be measured during read operations.

The storage of multiple resistance levels in a multi-level phase change memory cell is challenging, however, due to manufacturing process variability as well as intra-cell and inter-cell material parameter variations. For example, feed forward direct schemes are known that use a sequence of pulses of varying shapes such as described by J. B. Philipp and T. Happ in U.S. Pat. No. 7,372,725 B2, "Integrated Circuit Having Resistive Memory." In these cases, process and parameter variabilities may cause deviations of the achieved resistance levels from their intended resistance values. Accordingly, iterative programming schemes with multiple write-verify steps, which have been proposed, for example by J. B. Philipp, T. Happ, and M. H. Lee in U.S. Pat. No. 7,564,710 B2, "Circuit for Programming a Memory Element," may reach the desired resistance levels within a multi-level phase change memory cell. Iterative programming schemes, however, can be very time-consuming, because switching between read and write circuitry is necessary.

SUMMARY OF THE INVENTION

To overcome these deficiencies, the present invention provides a method for programming a multi-level phase change memory cell, including: applying a sequence of write pulses as a programming signal to the multi-level phase change memory cell and adjusting in real time at least one parameter of the write pulse as a function of a resistance error, the resistance error being determined as the difference between the resistance of the multi-level phase change memory cell and a reference resistance, wherein the reference resistance level is the desired resistance of the multi-level phase change memory cell.

In another aspect, the present invention provides a feedback controller for programming at least one multi-level phase-change memory cell with a programming signal including a sequence of write pulses applied to the multi-level phase-change memory cell, wherein the feedback controller adjusts in real time at least one parameter of the write pulse as a function of a resistance error, the resistance error being determined as the difference between the resistance of the multi-level phase change memory cell and a reference resistance, wherein the reference resistance level is the desired resistance of the multi-level phase change memory cell.

In yet another aspect, the present invention provides a phase change memory including: a plurality of multi-level phase-change memory cells and a feedback controller for programming at least one multi-level phase-change memory cell with a programming signal comprising a sequence of write pulses applied to said multi-level phase-change memory cell, wherein the feedback controller adjusts in real time at least one parameter of the write pulse as a function of a resistance error, the resistance error being determined as the difference between the resistance of the multi-level phase change memory cell and a reference resistance, wherein the reference resistance level is the desired resistance of the multi-level phase change memory cell.

BRIEF DESCRIPTION OF THE SEVERAL VIEWS OF THE DRAWINGS

Embodiments of the method for programming a multi-level phase change memory cell and a feedback controller for programming at least one multi-level phase change memory cell are described with reference to the enclosed figures.

DETAILED DESCRIPTION OF THE PREFERRED EMBODIMENTS

Figure 1:
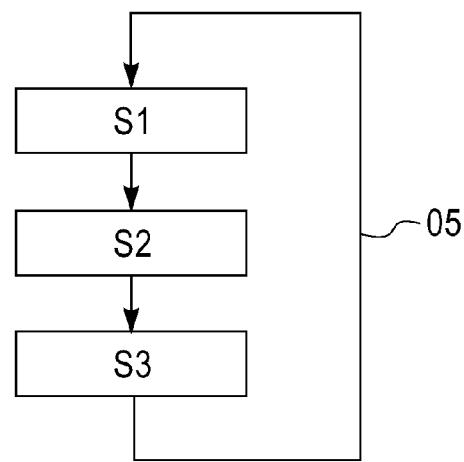
FIG. 1 shows a flowchart of a possible embodiment of the method for programming a multi-level phase change memory cell according to the present invention.

Embodiments of the method according to the present invention can provide a programming signal, i.e. a voltage or current signal, the shape of which is carefully adjusted such that at least some portion of the programming signal forms a reliable measure of the electrical resistance of the multi-level phase change memory cell to be programmed. Embodiments of the method according to the present invention can include the application of a sequence of write pulses as a programming signal to the multi-level phase change memory cell to be programmed. At least one parameter of each write pulse can be adjusted in real time as a function of a determined resistance error or resistance deviation of the multi-level phase change memory cell with respect to a reference resistance level to be achieved.

The programming signal used by the embodiments of the method according to the present invention can include a write portion and a read portion. In one possible embodiment the shape and amplitude of the programming signal in the read portion can be constant. The parameter of the programming signal is determined by the electrical switching behavior of the multi-level phase change memory cell. In another possible embodiment, the write pulse parameter, which is adjusted in real time as a function of the determined resistance error of the multi-level phase change memory cell, is the amplitude of the write pulse of the programming signal. In an alternative embodiment the parameter to be adjusted is not the amplitude; instead it is the duration of the write pulse of the respective programming signal. In a further embodiment the write pulse parameter to be adjusted is the slope of the write pulse of the programming signal.

In one embodiment only one parameter of each write pulse is adjusted in real time as a function of a determined resistance error of the multi-level phase change memory cell with respect to a reference resistance level to be achieved. In an alternative embodiment more than one parameter of each write pulse, such as amplitude, duration, and slope of the write pulse are adjusted in real time as a function of the determined resistance error.

The resistance error is determined during a read period or a read portion between write pulses of the programming signal. In another embodiment the write pulse parameter of the programming signal is obtained by a feedback controller on the basis of the determined resistance error. In one embodiment the feedback controller obtains the write pulse parameter in the discrete domain. In an alternative embodiment the feedback controller obtains the write pulse parameter in the analog domain.

In an embodiment of the method according to the present invention for programming a multi-level phase change memory cell, the write pulse parameter is the pulse amplitude where this write pulse amplitude is obtained by a feedback controller in the analog domain on the basis of a determined resistance error of the multi-level phase change memory cell to be programmed.

FIG. 1 shows a flowchart of a possible embodiment of the method according to the present invention performed by an analog feedback controller which performs the following steps for programming a multi-level phase change memory cell.

In a first step S1 a write offset signal and a feedback signal are summed to generate a write signal applied to the multi-level phase change memory cell to be programmed.

In the next step S2 a reference current, $I_{ref}$, is subtracted from a current sample of the multi-level phase change memory cell taken during a read period of the write signal to generate a current error signal that corresponds to the resistance error of the multi-level phase change memory cell, the resistance error being determined with respect to the desired reference resistance level $R_{ref}$.

In a further step S3 the generated current error signal is integrated to provide the feedback signal. This feedback signal 05 is added to the write offset signal to generate the write signal applied to the multi-level phase change memory cell.

In one possible embodiment the reference current $I_{ref}$ that is subtracted from the current sample in step S2 is adjusted depending on the desired reference resistance level and can be provided by a reference current source. The reference current source can be controlled by a control signal from a control circuit.

Figure 2:
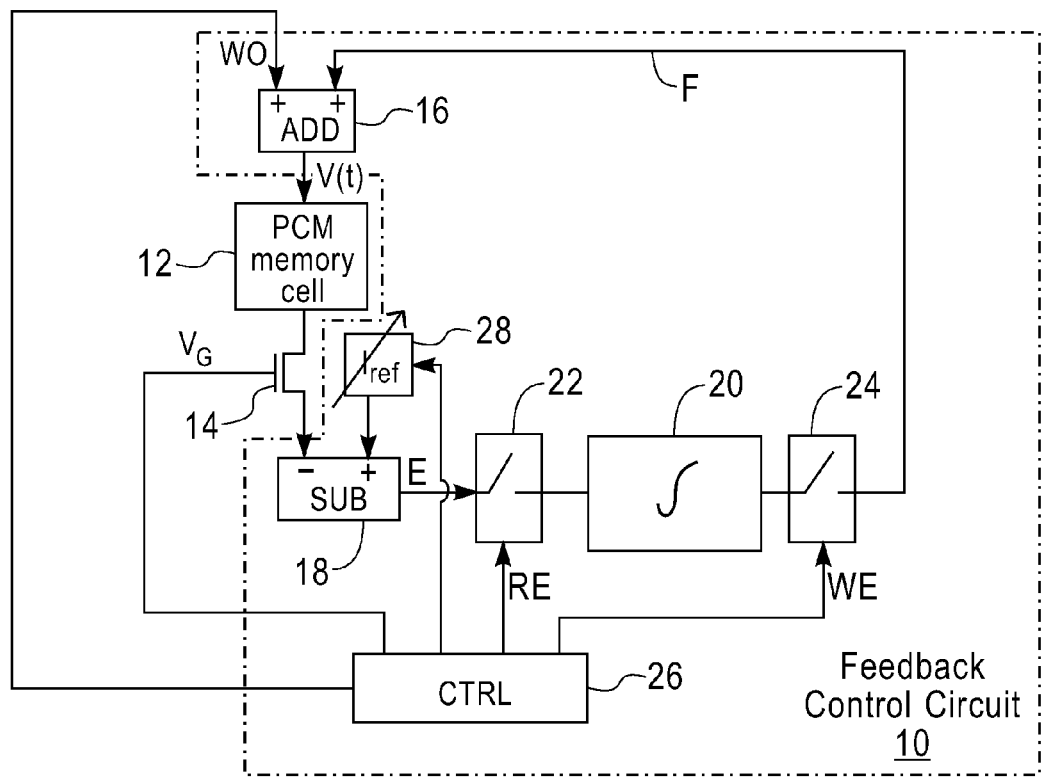
FIG. 2 shows a block diagram of a possible embodiment of a feedback controller according to the present invention.

FIG. 2 shows a block diagram of a possible embodiment of a feedback controller 10 according to the present invention. In the feedback control circuit 10 shown in FIG. 2 the write pulse parameter is obtained in the analog domain. According to the embodiment shown, multi-level phase change memory cell 12 can be programmed or written to by applying a signal V(t). The multi-level phase change memory cell 12 includes an integrated transistor such as a MOSFET 14 shown in FIG. 2. MOSFET 14 is mostly used as a switch to select the cell but can also be used to program the cell according to its gate voltage. Varying the gate voltage varies the current passing through the cell for a fixed $V_{DD}$.

The analog feedback controller 10 shown in FIG. 2 is used for programming the multi-level phase change memory cell 12 with a programming signal including a sequence of write pulses applied to the multi-level phase change memory cell 12. The feedback controller 10 adjusts at least one parameter of each write pulse in real time as a function of the resistance error of the multi-level phase change memory cell 12 determined with respect to the desired reference resistance level $R_{ref}$. In the embodiment shown of FIG. 2 the write pulse parameter adjusted by the feedback controller 10 is the amplitude of the write pulse. As can be seen in FIG. 2 the feedback controller 10 includes summing means 16 for summing a write offset signal WO and a feedback signal F. The summed signal forms the programming signal to be applied to the multi-level phase change memory cell 12.

The analog feedback controller 10 shown in FIG. 2 also includes subtracting means 18 for subtracting reference current $I_{ref}$ from a current sampled from the multi-level phase change memory cell 12 taken during a read period of the write signal to generate a current error signal E that corresponds to the determined resistance error. Furthermore, the analog feedback controller 10 includes an analog integrator 20 for integrating the current error signal E to provide feedback signal F. At the input side of the analog integrator 20 a first switch 22 is provided which switches the output of the subtracting means 18 to the input of the analog integrator 20. At the output side of the analog integrator 20 a second switch 24 is provided which switches the integrated output signal as a feedback signal F to the summing means 16. The first switch 22 is controlled by a read enable control signal RE whereas the second switch 24 is controlled by a write enable control signal WE. Both control signals are provided by a control circuit 26.

In the shown embodiment of FIG. 2 the control circuit 26 is a local control circuit integrated in the feedback control circuit 10. In an alternative embodiment the control signals are supplied from a remote control provided on the phase-change memory chip. In a further embodiment the control signals are applied from a remote control connected to the phase change memory chip.

In the embodiment shown in FIG. 2 the control circuit 26 provides a control signal $V_G$ for controlling the gate voltage of the MOSFET 14. Furthermore the control circuit 26 controls an adjustable reference current source 28. The reference current $I_{ref}$ of the reference current source 28 is adjusted depending on the desired reference resistance level. This adjustable reference current is generated by the reference current source 28 in response to the control signal provided by the control circuit 26. The feedback control circuit 10 can program a plurality of multi-level phase change memory cells integrated in a memory chip. Each multi-level phase change memory cell can include a corresponding MOSFET 14 to read out data.

Figure 3:
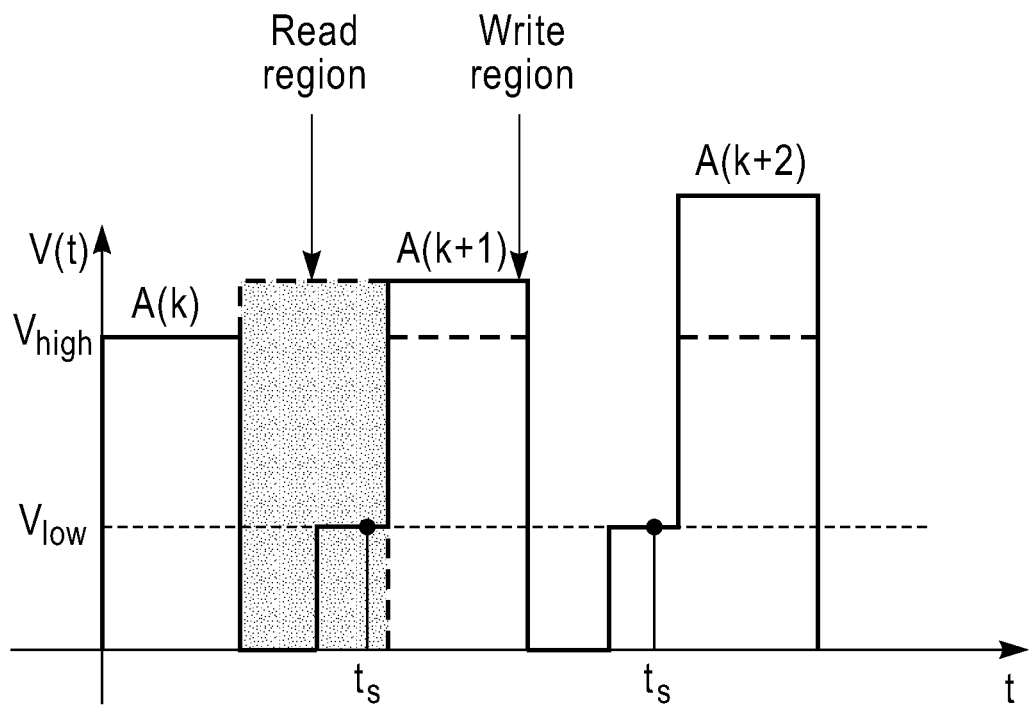
FIG. 3 shows an example of a programming signal to illustrate the method and feedback controller according to the present invention.

FIG. 3 shows a signal diagram of a programming signal for programming the multi-level phase change memory cell 12 of FIG. 2 including a sequence of write pulses to change physical properties of the phase change material to achieve a desired reference resistance level. If the programming voltage signal V(t) is bigger than the threshold switching voltage $V_{TH}$ (V(t)>$V_{TH}$), the measured resistance of the multi-level phase change memory cell is independent of an amorphous fraction, where the amorphous fraction is the amorphous thickness of the phase change material divided by the total thickness of the phase change material. If the low read voltage $V_{low}$ is smaller than the threshold switching voltage ($V_{low}<V_{TH}$) then a reliable measure of the resistance can be obtained.

The amplitude of the first write pulse (A(k)) starts with an initial amplitude which is an estimate of the current needed to achieve the desired resistance level. During a read region or read portion of the programming signal, i.e. before the next write pulse is applied, a resistance measurement is performed. At the sampling time $t_s$ a sample current is taken from the multi-level phase change memory cell 12 to calculate or generate a deviation to a reference current ($I_{ref}$) which is a current error E corresponding to the resistance error of the multi-level phase change memory cell 12 of FIG. 2 which is determined with respect to the desired reference resistance level $R_{ref}$. The write pulse amplitude A is then adjusted in real time as a function of the determined resistance error. For example the amplitude of the next write pulse (A(k+1)) is increased with respect to the amplitude (A(k)) of the first pulse. This adjustment is performed in real time. The amplitude (A(k+1)) of the subsequent write pulse (k+1) is determined by the analog feedback controller 10 as a function of the resistance error with respect to a reference resistance $R_{ref}$. The resistance error is determined during a low voltage read region of the programming signal in real time.

Figure 4:
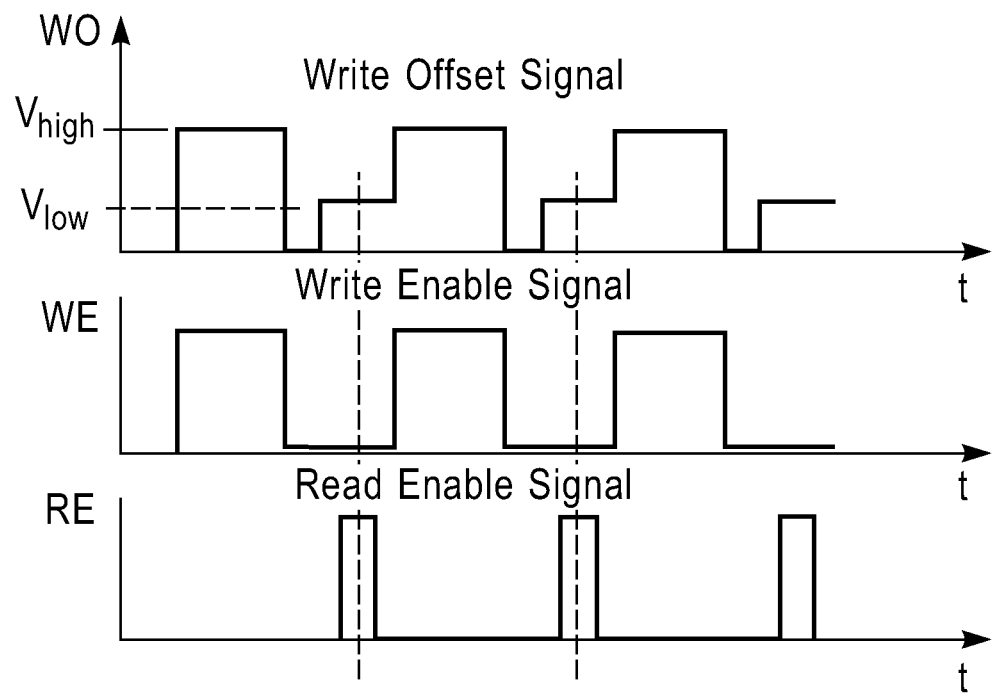
FIG. 4 shows signal diagrams corresponding to the implementation of the feedback controller shown in FIG. 2.

FIG. 4 shows signal diagrams of a write offset signal WO, a write enable control signal WE and a read enable control signal RE as used by the analog feedback controller 10 shown in FIG. 2. The write offset signal WO can be a periodic signal including three amplitude steps: an amplitude of nearly zero volts, a low amplitude $V_{10}$ of e.g. 0.3 V and a high amplitude of e.g. 2 V. When the sampled error current is applied to the integrator 20 the read enable control signal RE is high. The feedback signal F is fed back to the summing means 16 when the write enable control signal WE is logical high. The feedback control circuit 10 shown in FIG. 2 for programming of a multi-level phase change memory cell can be very fast having a total programming time of less than 1 µs. In one possible embodiment one iteration step including the switching of the control level switches 22 and 24 takes less than 100 nanoseconds. In one possible embodiment of a present controller less than five iterations are necessary to achieve the desired reference resistance level.

The feedback controller 10 as shown in FIG. 2 can be used to program different kinds of multi-level phase change memory cells, i.e. multi-level memory cells including 2, 4, 8, . . . $2^N$ resistance levels, where N is an integer number.

Figure 5:
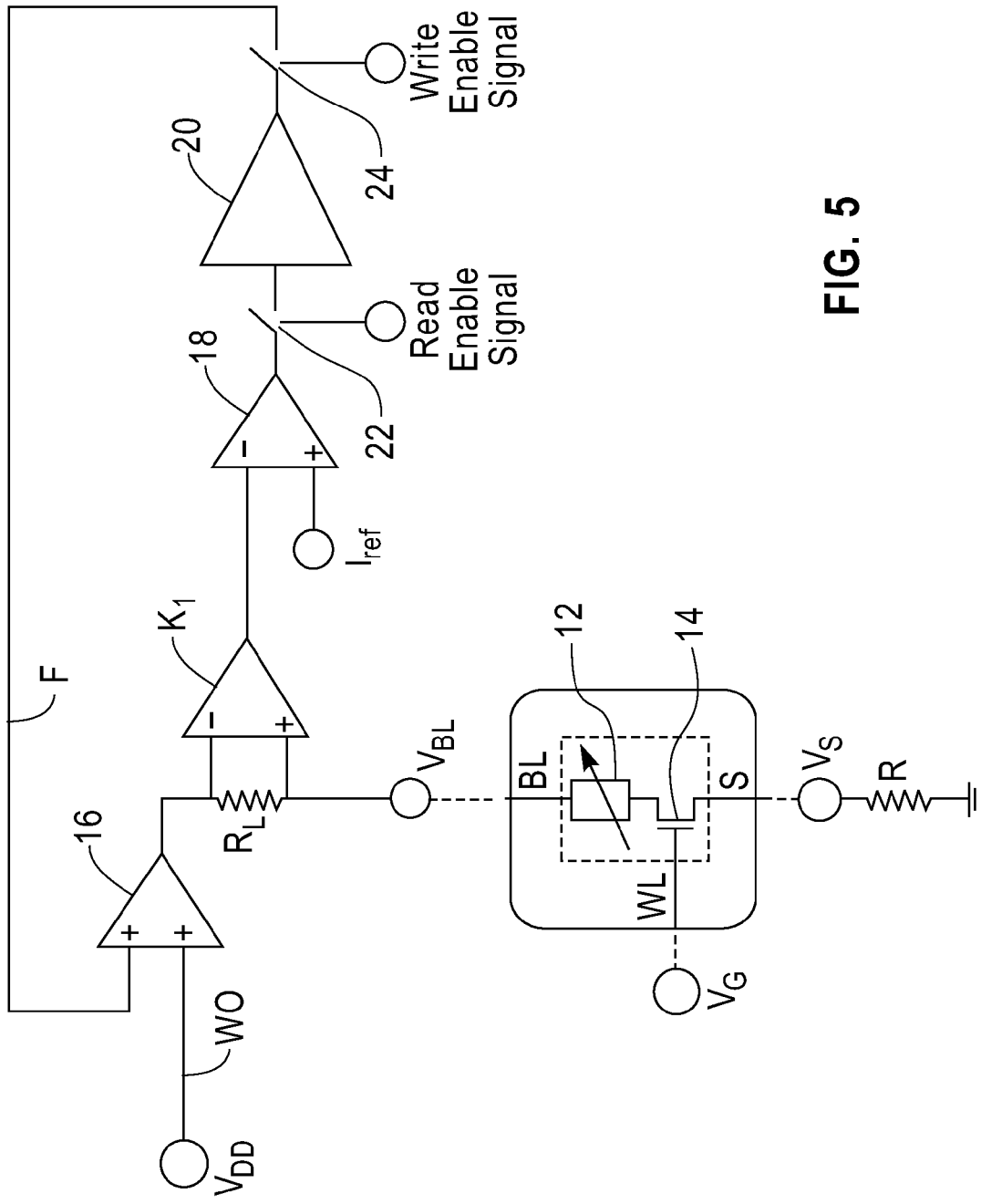
FIG. 5 shows a possible implementation of a feedback controller according to an embodiment of the present invention.

FIG. 5 shows a possible implementation of a feedback control circuit 10 as shown in FIG. 2. In this embodiment the current sample of the multi-level phase change memory cell 12 is measured by means of a resistor $R_L$ and an operational amplifier with a gain K1. In this embodiment the summing means 16 is an operational amplifier and has the feedback signal F and write offset signal WO applied at the $V_{DD}$ as inputs. Also in this embodiment the subtracting means 18 is formed by an operational amplifier circuit with the inputs being a reference current $I_{REF}$ and the output of the operational amplifier with a gain K1. The integrator circuit 20 is also formed by an operational amplifier. The read enable 22 and write enable 24 switches are also on either side of the integrator circuit 20 as shown. As in FIG. 2, the multi-level phase change memory cell 12 is hooked up to the MOSFET 14. The MOSFET 14 is connected to a source voltage $V_S$ and a gate voltage $V_G$ providing a word line voltage WL. The multi-level phase change memory cell 12 is also connected to a bit line voltage $V_{BL}$. Other implementations of the feedback control circuit 10 without operational amplifiers of the feedback control circuit 10 are possible. The feedback control circuit 10 can be integrated with one or a plurality of multi-level phase change memory cells in a phase change memory chip.

In the embodiment shown in FIG. 2 the feedback controller 10 is formed by an analog circuit. In an alternative embodiment the feedback controller can also be implemented as a discrete feedback controller. In this embodiment a write pulse parameter is calculated iteratively by the discrete feedback controller as follows:

$$P(k+1)=f(P(k),R_{ref}-R(k))$$

wherein:
P is at least one write pulse parameter,
k is the sequential number of the respective write pulse,
$R_{ref}$ is the predetermined reference resistance level of the multi-level phase change memory cell 12, and
R(k) is the measured resistance level of the multi-level phase change memory cell 12.

Figure 6:
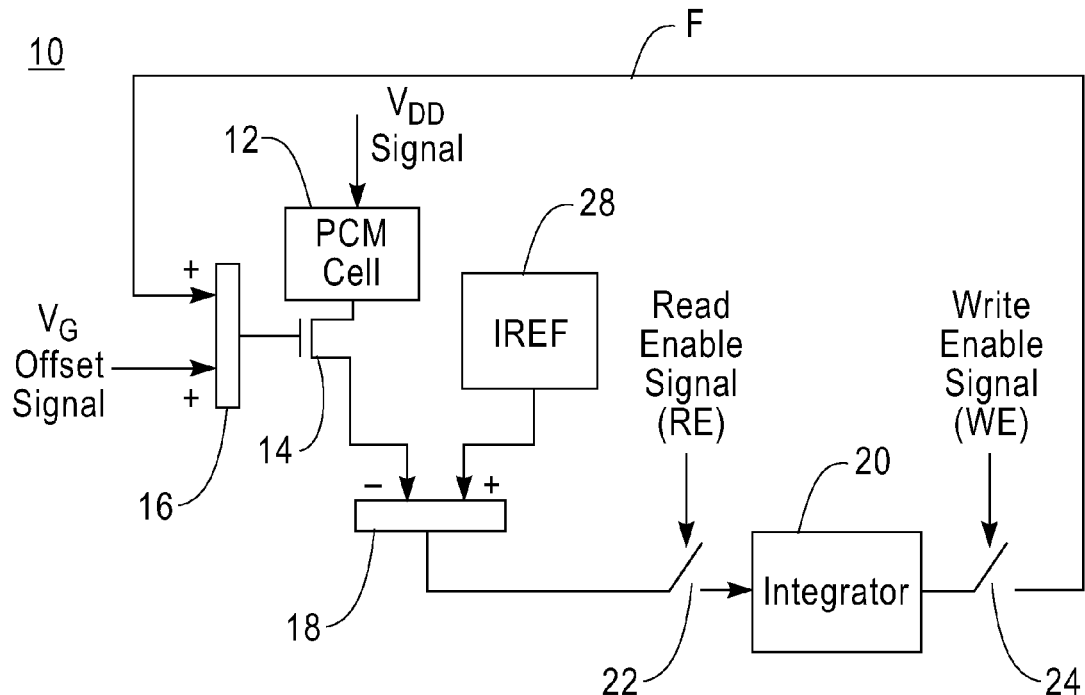
FIG. 6 shows a block diagram of an alternative embodiment of a feedback controller according to the present invention.

FIG. 6 shows an alternative embodiment of a feedback controller 10 according to the present invention. In the embodiment of FIG. 6 the write signal for programming the multi-level phase change memory cell 12 is applied to the gate of the MOSFET 14 instead of at the $V_{DD}$ of the cell as in the embodiment of FIG. 2. In the embodiment of FIG. 6 the varying write signal is applied at the gate of the MOSFET 14. The MOSFET 14 is mostly used as a switch to select the multi-level phase change memory cell 12 but is also used in the embodiment shown of FIG. 6 to program the multi-level phase change memory cell 12 using the gate voltage. Varying the gate voltage varies the current passing through the multi-level phase change memory cell 12 for a fixed $V_{DD}$ voltage.

Figure 7:
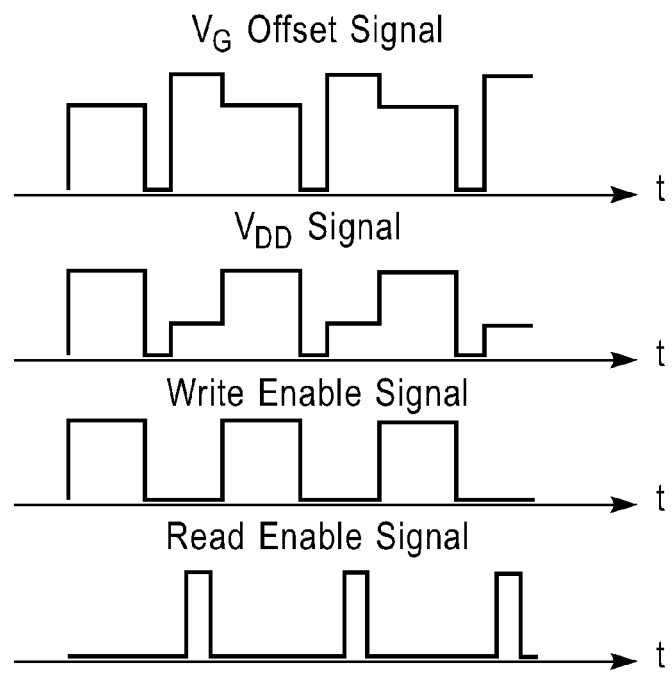
FIG. 7 shows signal diagrams corresponding to the implementation of the feedback controller of FIG. 6.

FIG. 7 shows signal diagrams for illustrating the functionality of the feedback controller 10 of FIG. 6. The four signals shown are the four signals illustrated in FIG. 6. Read enable signals and write enable signals are digital signals used to control the switches S1 and S2 respectively. The amplitude of the $V_G$ offset signal during the time the write enable signal is ON is selected based on an initial estimate on the $V_G$ signal needed to reach a desired resistance level. The amplitude of the $V_G$ offset signal during the time the read enable signal is ON is fixed to some high value such that a reliable measure of the cell resistance can be obtained. The amplitude of the $V_{DD}$ signal during the time the write enable signal is ON is chosen to be value higher than that needed for threshold switching to occur and for the transistor to provide sufficient current. The amplitude of the $V_{DD}$ signal during the time the read enable signal is ON is chosen to be equal to the read bias voltage where a reliable measure of the cell resistance can be obtained.

Figure 8:
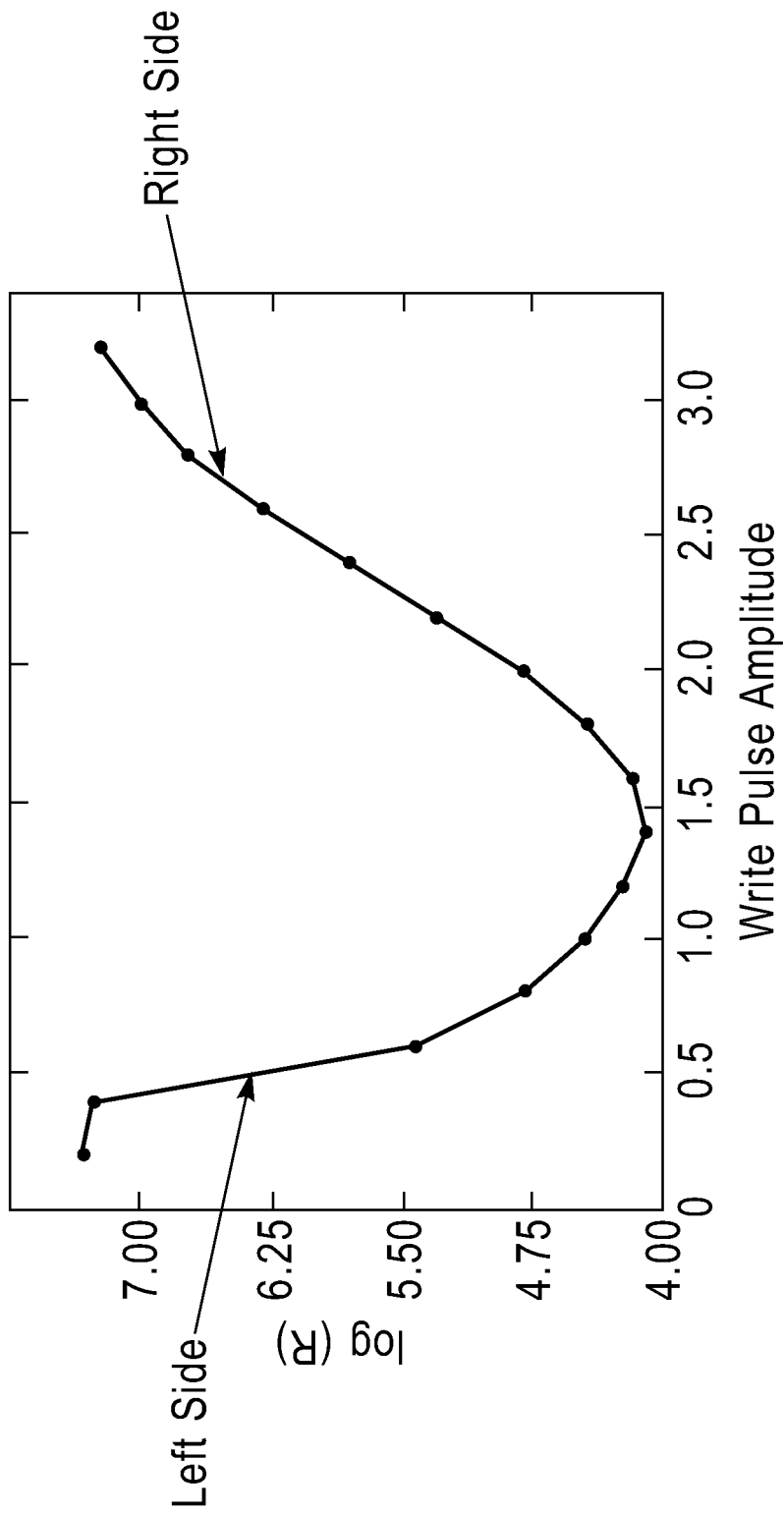
FIG. 8 shows an exemplary programming curve for a multi-level phase change memory cell according to an embodiment of the present invention.

FIG. 8 shows an exemplary embodiment of a programming curve for a multi-level phase change memory cell. The curve shows the dependence of the cell resistance on the write pulse amplitude. As can be seen from FIG. 8 the cell resistance is minimal at a certain write pulse amplitude and shows on the left side a falling resistance with increasing write pulse amplitude before the minimum is reached. After that the curve shows on the right side an increasing resistance with increasing write pulse amplitude. The integrator 20 of the feedback control circuit 10 of FIG. 2 amplifies the signal with a predetermined gain. In one embodiment the gain of the integrator 20 can be changed. In another embodiment the sign of the gain of the integrator 20 is changed depending on whether the integrator 20 operates on the left or right side of the programming curve shown in FIG. 8. In yet another embodiment the gain of the integrator 20 is switched depending on a control signal. In a further possible embodiment, the feedback controller can be more sophisticated than an integral controller.

In a possible embodiment the write pulse parameter P is the write pulse amplitude. This write pulse parameter can be calculated iteratively by the discrete feedback controller as follows:

$$P(k+1)=P(k)+k_i[R_{ref}-R(k)],$$

wherein:
P is the write pulse parameter (i.e. the amplitude),
k is the sequential number of the respective write pulse,
$k_i$ is a weighting factor,
$R_{ref}$ is a desired reference resistance level of the multi-level phase change memory cell 12, and
R(k) is the measured resistance level of the multi-level phase change memory cell 12.

The method and apparatus according to embodiments of the present invention can allow for programming a multi-level phase change memory cell 12 with a high resolution and are suited to program the multi-level phase change memory cell 12 having several resistance levels such as $2^N$ resistance levels in the case of storing N bits. The quantization noise does not affect the write programming scheme according to the present invention. The method and device for programming a multi-level phase change memory cell 12 according to embodiments of the present invention may have low complexity and may allow for a very fast programming of the memory cell 12.

The method and controller for programming a multi-level phase change memory cell 12 can also be used to compensate for drift of the memory cell occurring during operation of the multi-level phase change memory cell 12 over a longer time. This can be achieved by reprogramming or refreshing the cell at periodic intervals using the programming scheme described above. In one possible embodiment the programming of a multi-level phase change memory cell 12 having a feedback controller is terminated or stopped if a predetermined stop criterion is met. For example, the programming may stop when the current error is lower than a predetermined threshold value. This threshold value can be used to adjust the programming time depending on the respective application. A phase change memory chip according to embodiments of the present invention can include one or more feedback controllers 10 such as is shown in FIG. 2 and a plurality of multi-level phase change memory cells 12. Such a phase change memory can be used as a random access memory as well as for mass data storage. The feedback control circuit 10 can also be used as a drift compensation control circuit for multi-level phase change memory cells 12.

Any disclosed embodiment can be combined with one or several of the other embodiments shown and/or described. This is also possible for one or more features of the embodiments.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

Additional Embodiment Details

The described techniques may be implemented as a method, apparatus or article of manufacture involving software, firmware, micro-code, hardware and/or any combination thereof. The term "article of manufacture" as used herein refers to code or logic implemented in a medium, where such medium may comprise hardware logic, e.g., an integrated circuit chip, Programmable Gate Array (PGA), Application Specific Integrated Circuit (ASIC), etc. or a computer readable medium, such as magnetic storage medium (e.g., hard disk drives, floppy disks, tape, etc.), optical storage (CD-ROMs, optical disks, etc.), volatile and non-volatile memory devices, e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.

Code in the computer readable medium is accessed and executed by a processor. The medium in which the code or logic is encoded may also comprise transmission signals propagating through space or a transmission media, such as an optical fiber, copper wire, etc. The transmission signal in which the code or logic is encoded may further comprise a wireless signal, satellite transmission, radio waves, infrared signals, Bluetooth, etc. The transmission signal in which the code or logic is encoded is capable of being transmitted by a transmitting station and received by a receiving station, where the code or logic encoded in the transmission signal may be decoded and stored in hardware or a computer readable medium at the receiving and transmitting stations or devices. Additionally, the "article of manufacture" may comprise a combination of hardware and software components in which the code is embodied, processed, and executed. Of course, those skilled in the art will recognize that many modifications may be made without departing from the scope of embodiments, and that the article of manufacture may comprise any information bearing medium. For example, the article of manufacture comprises a storage medium having stored therein instructions that when executed by a machine results in operations being performed.

Certain embodiments can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, certain embodiments can take the form of a computer program product accessible from a computer usable or computer readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries. Additionally, a description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article. The functionality and/or the features of a device may be alternatively embodied by one or more other devices which are not explicitly described as having such functionality/features. Thus, other embodiments need not include the device itself.

Computer program means or computer program in the present context mean any expression, in any language, code or notation, of a set of instructions intended to cause a system having an information processing capability to perform a particular function either directly or after either or both of the following a) conversion to another language, code or notation; b) reproduction in a different material form.

What is claimed is:

1. A method for programming a multi-level phase change memory cell, comprising:
    applying a sequence of write pulses as a programming signal to said multi-level phase change memory cell; and
    adjusting in real time at least one parameter of said write pulse as a function of a resistance error;
    wherein said resistance error is determined as the difference between the resistance of the multi-level phase change memory cell and a reference resistance level;
    wherein said reference resistance level is a desired resistance of said multi-level phase change memory cell; and
    wherein said parameter of said write pulse of said programming signal is determined on the basis of said resistance error by calculating said write pulse parameter using either step A, step B, or step C as follows:
    wherein step A comprises calculating said write pulse parameter in the analog domain by summing a write offset signal and a feedback signal to generate a write signal applied to said multi-level phase change memory cell, subtracting a reference current $I_{ref}$) from a current sample of said multi-level phase change memory cell taken during a read period of said write signal to generate a current error signal corresponding to said resistance error of said multi-level phase change memory cell, and integrating said generated current error signal to provide said feedback signal,
    wherein step B comprises calculating iteratively said write pulse parameter in the discrete domain as follows: $P(k+1)=f(P(k), R_{Ref}-R(k))$, wherein P is said write pulse parameter, k is a sequential number of said respective write pulse, $R_{Ref}$ is said reference resistance level of said multi-level phase change memory cell, and R(k) is a measured resistance level of the multi-level phase change memory cell, and
    wherein step C comprises calculating iteratively said write pulse parameter in the discrete domain, wherein said write pulse parameter is a write pulse amplitude, as follows: $P(k+1)=P(k)+k_i [R_{Ref}-R(k)]$, wherein P is said write pulse amplitude, k is a sequential number of said write pulse amplitude, $k_i$ is an adjustable weighting factor, $R_{Ref}$ is said reference resistance level of said multi-level phase change memory cell, and R(k) is said measured resistance level of said multi-level phase change memory cell.

2. The method according to claim 1, wherein said resistance error is determined during a read period between said write pulses of said programming signal.

3. The method according to claim 2, wherein said parameter of said write pulse of said programming signal is determined by a feedback controller on the basis of said resistance error.

4. The method according to claim 1, wherein said write pulse parameter is calculated in the analog domain, and wherein said reference current ($I_{ref}$) is adjusted depending on said reference resistance level.

5. The method according to claim 4, wherein said write offset signal has an amplitude which is below a predetermined threshold switching amplitude of said multi-level phase change memory cell when taking said current sample.

6. The method according to claim 5, wherein said write pulse parameter is selected from the group consisting of: an amplitude, a duration, and a slope of said write pulse of said programming signal.

7. The method according to claim 1, wherein said write pulse parameter is selected from the group consisting of an amplitude, a duration, and a slope of said write pulse of said programming signal.

8. A computer readable article of manufacture tangibly embodying computer readable instructions which when executed cause a computer to carry out the steps of a method according to claim 1.

9. A feedback controller for programming at least one multi-level phase change memory cell with a programming signal comprising:
a sequence of write pulses applied to said multi-level phase change memory cell;
wherein said feedback controller adjusts in real time at least one parameter of said write pulse as a function of a resistance error;
wherein said resistance error being determined as the difference between the resistance of said multi-level phase change memory cell and a reference resistance level;
wherein said reference resistance level is a desired resistance of said multi-level phase change memory cell; and
wherein said feedback controller is configured to have either configuration A, configuration B, or configuration C:
wherein configuration A comprises said feedback controller being an analog feedback controller that has summing means for summing a write offset signal and a feedback signal, subtracting means for subtracting a reference current ($I_{ref}$) from a current sample of said multi-level phase change memory cell taken during a read period of said write signal to generate a current error signal corresponding to said resistance error, and integrating means for integrating said current error signal to provide said feedback signal,
wherein configuration B comprises said feedback controller being a discrete feedback controller that is configured to calculate iteratively at least one parameter of each write pulse as a function of said resistance error of said multi-level phase change memory cell with respect to said reference resistance level as follows: $P(k+1)=f(P(k), R_{Ref}-R(k))$, wherein P is said write pulse parameter; k is a sequential number of said respective write pulse; $R_{Ref}$ is said reference resistance level of said multi-level phase change memory cell, and R(k) is a measured resistance level of said multi-level phase change memory cell, and
wherein configuration C comprises said feedback controller being a discrete feedback controller that is configured to calculate iteratively a write pulse amplitude of each write pulse as a function of said resistance error of said multi-level phase change memory cell with respect to said reference resistance level as follows: $P(k+1)=P(k) +k_i [R_{Ref}-R(k)]$, wherein P is said write pulse amplitude, k is a sequential number of said write pulse, $k_i$ is an adjustable weighting factor, $R_{Ref}$ is said reference resistance level of said multi-level phase change memory cell, and R(k) is said measured resistance level of said multi-level phase change memory cell.

10. The feedback controller according to claim 9, wherein said feedback controller is an analog feedback controller, and wherein said analog feedback controller comprises an adjustable reference current source for generating said reference current ($I_{ref}$) in response to a control signal.

11. The feedback controller according to claim 9, wherein said write pulse parameter is selected from the group consisting of an amplitude, a duration, and a slope of said write pulse of said programming signal.

12. A phase change memory comprising:
a plurality of multi-level phase change memory cells; and
a feedback controller for programming at least one multi-level phase change memory cell with a programming signal comprising a sequence of write pulses applied to said multi-level phase-change memory cell;
wherein said feedback controller adjusts in real time at least one parameter of said write pulse as a function of a resistance error;
wherein said resistance error is determined as the difference between the resistance of said multi-level phase change memory cell and a reference resistance level; and
wherein said reference resistance level is a desired resistance of said multi-level phase change memory cell; and
wherein said feedback controller is configured to have either configuration A, configuration B, or configuration C:
wherein configuration A comprises said feedback controller being an analog feedback controller that has summing means for summing a write offset signal and a feedback signal, subtracting means for subtracting a reference current ($I_{ref}$) from a current sample of said multi-level phase change memory cell taken during a read period of said write signal to generate a current error signal corresponding to said resistance error, and integrating means for integrating said current error signal to provide said feedback signal,
wherein configuration B comprises said feedback controller being a discrete feedback controller that is configured to calculate iteratively at least one parameter of each write pulse as a function of said resistance error of said multi-level phase change memory cell with respect to said reference resistance level as follows: $P(k+1)=f(P(k), R_{Ref}-R(k))$, wherein P is said write pulse parameter; k is a sequential number of said respective write pulse; $R_{Ref}$ is said reference resistance level of said multi-level phase change memory cell, and R(k) is a measured resistance level of said multi-level phase change memory cell, and
wherein configuration C comprises said feedback controller being a discrete feedback controller that is configured to calculate iteratively a write pulse amplitude of each write pulse as a function of said resistance error of said multi-level phase change memory cell with respect to said reference resistance level as follows: $P(k+1)=P(k) +k_i [R_{Ref}-R(k)]$, wherein P is said write pulse amplitude, k is a sequential number of said write pulse, $k_i$ is an adjustable weighting factor, $R_{Ref}$ is said reference resistance level of said multi-level phase change memory cell, and R(k) is said measured resistance level of said multi-level phase change memory cell.

* * * * *